(12) United States Patent
Guan

(10) Patent No.: US 7,134,036 B1
(45) Date of Patent: Nov. 7, 2006

(54) PROCESSOR CORE CLOCK GENERATION CIRCUITS

(75) Inventor: Xiujun Guan, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 444 days.

(21) Appl. No.: 10/735,104

(22) Filed: Dec. 12, 2003

(51) Int. Cl.
*G06F 1/04* (2006.01)
*H03B 19/00* (2006.01)

(52) U.S. Cl. .................. 713/500; 713/600; 327/116

(58) Field of Classification Search ............. 713/500, 713/600, 375, 400, 401; 327/116
See application file for complete search history.

(56) References Cited

U.S. PATENT DOCUMENTS

| | | | |
|---|---|---|---|
| 5,133,064 A * | 7/1992 | Hotta et al. | 713/375 |
| 6,177,844 B1 * | 1/2001 | Sung et al. | 331/25 |
| 6,477,221 B1 * | 11/2002 | Ning | 378/4 |
| 6,730,945 B1 * | 5/2004 | Chaki | 257/159 |
| 6,753,709 B1 * | 6/2004 | El-Kik | 327/116 |
| 6,950,488 B1 * | 9/2005 | Chung et al. | 375/376 |

OTHER PUBLICATIONS

Hsiang-Hui Chang, Jyh-Woei Lin, Ching-Yuan Yang, Shen-Iuan Liu, "A Wide Range Delay-Locked Loop With a Fixed Latency of One Clock Cycle," IEEE Journal of Solid-State Circuits, vol. 37, No. 8, Aug. 2002, pp. 1021-1027.

Chulwoo Kim, In-Chul Hwang, Sung-Mo (Steve) Kang, "A Low-Power Small-Area ±7.28-ps-Jitter 1-GHz DLL-Based Clock Generator," IEEE Journal of Solid-State Circuits, vol. 37, No. 11, Nov. 2002, pp. 1414-1420.

* cited by examiner

*Primary Examiner*—Chun Cao
*Assistant Examiner*—Suresh K Suryawanshi
(74) *Attorney, Agent, or Firm*—Martine Penilla & Gencarella, LLP (57) ABSTRACT

An invention is provided for generating custom clock frequencies within a processor core. A CPU clock signal propagates through a DLL circuit. Further, a control signal controls the CPU clock signal as the signals propagate through multiple inverters in the DLL circuit. The multiple inverters delay the CPU clock signal and generate multiple output signals. Subsequently, the multiple output signals are combined to generate a higher frequency signal than the CPU clock signal. To control the CPU clock signal, the DLL circuit includes a charge pump to lock in a precise control signal. The charge pump further includes circuitry, such as a Schmitt circuit, to increase and decrease voltage.

14 Claims, 12 Drawing Sheets

PROCESSOR CORE CLOCK GENERATION CIRCUITS

BACKGROUND OF THE INVENTION

1. Field of the Invention

This invention relates generally to clock generation and more specifically, to internal custom clock frequency generation.

2. Description of the Related Art

Figure 1:
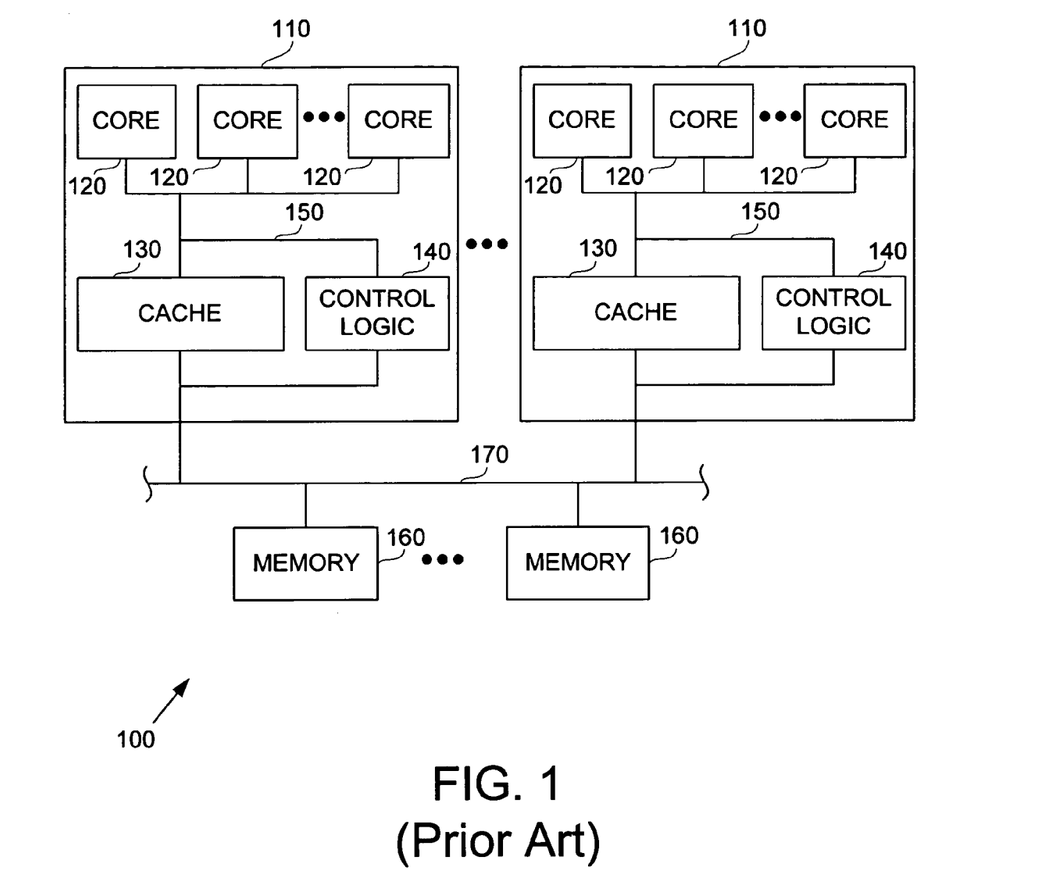
FIG. 1 is a diagram of a computer illustrating a central processing unit (CPU) with a microcore (core)

Designs of advanced superscalar microprocessor architectures require reliable timing relationships between the various frequencies propagated within the superscalar microprocessor architecture. An example of one superscalar microprocessor architecture is shown in FIG. 1, which is a diagram of a computer 100 illustrating a central processing unit (CPU) 110 with a microcore (core) 120. Computer 100 can have multiple CPUs 110 connected to one or more memory 160 elements via a system bus 170. Typically, memory 160 compositions include DRAM, SRAM or flip-flops, which function as storage for data and instructions. Within CPU 110, one or more cores 120 use an interconnect 150 to transfer data and instructions to a cache 130. Further, a control logic 140 uses interconnect 150 to control the flow of data and instructions within CPU 110.

Typically, current CPUs 110 operate at higher frequencies than other motherboard components, such as hard-wired device drivers and memory 160. Consequently, motherboard designs incorporated methods to manipulate the different frequencies to enable proper motherboard operation. Similarly, internal elements of cores 110 operate at multiple frequencies. Current optimal superscalar microprocessor architectures insert delay circuitry, which forces faster, higher frequency component to wait, while slower, lower frequency components process data and instructions.

Figure 2:
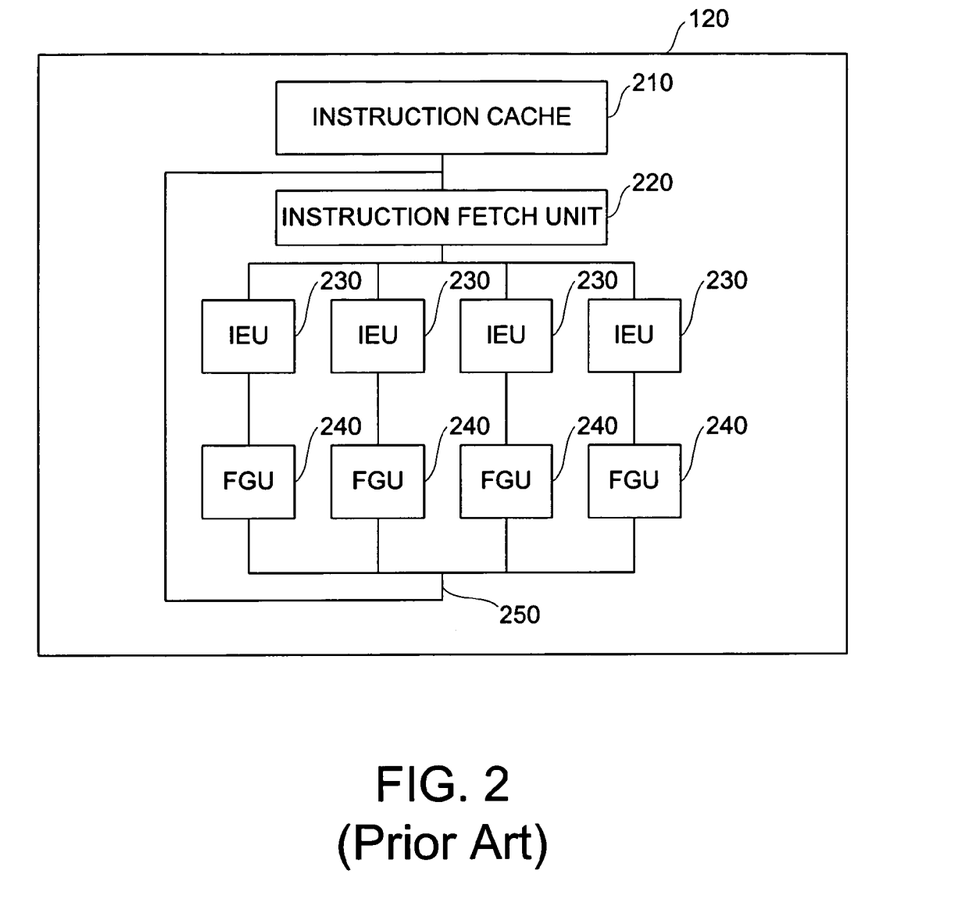
FIG. 2 is a diagram illustrating elements of a core in the CPU.

FIG. 2 is a diagram illustrating elements of core 120 (FIG. 1) in CPU 110. Core 120 can include an instruction cache 210, an instruction fetch unit (IFU) 220, multiple integer execution units (IEU) 230 and multiple floating-point graphics units (FGUs) 240. An FGU interconnect 250 connects the output from FGU 240 to IFU 220. Typically, IFU 220 retrieves data and instructions from instruction cache 210. If necessary, core 120 can also retrieve data and instructions from cache 130 and memory 160. Each IEU 230 includes an arithmetic logic unit (ALU) for computation in addition to other logic elements. Further, each IEU 230 connects to one FGU 240. Within each FGU 240 is a multiplier pipeline and an adder pipeline, which perform floating-point arithmetic and other graphics computations. Ultimately, output from FGU 240 travels via FGU interconnect 250 for use by IFU 220.

One problem with the design illustrated in FIG. 2 is the one-to-one relationship between IEU 230 and FGU 240. Because each FGU 240 has a multiplier pipeline and an adder pipeline, core 120 uses eight pipelines. As the number of IEUs 230 increase to exploit parallel computation, the number of FGUs 240 correspondingly increase. This results in increased circuitry in core 120 and CPU 110. A possible solution to the problem of increasing circuitry is to remove elements within core 120. However, while this solution reduces circuitry, another problem results.

Each IEU 230 synchronizes operations to the CPU system clock. In the example shown on FIG. 2, during one clock cycle, each IEU 230 sends output to an FGU 240. Upon removal of an FGU 240, only three FGUs 240 remain to process four IEU 230 outputs. Similarly, upon removal of another FGU 240, only two FGUs 240 remain to process four IEU 230 outputs. This requires the remaining FGUs 240 to delay the IEU 230 outputs to handle each output separately.

Accordingly, what is needed is a solution to reduce circuitry on a core 120 while adhering to the goals of designing optimal superscalar microprocessor architectures.

SUMMARY OF THE INVENTION

Broadly speaking, the present invention fills these needs by providing one embodiment of a processor defined by a cache capable of storing data, a control logic capable of controlling a flow of data and at least one core coupled to the cache and the control logic, capable of generating a multiple of a CPU clock signal. The core is further defined by an instruction cache capable of storing data, an instruction fetch unit capable of fetching data, a plurality of integer execution units coupled to the instruction fetch unit and a single floating point graphics unit coupled to the plurality of integer execution units including circuitry capable of generating the multiple of the CPU clock signal.

One embodiment of the invention is also defined by a circuit with a floating point graphics unit having a voltage control delay line unit capable of generating multiple delayed clock signals, a phase frequency detector coupled to the voltage control delay line unit capable of detecting phase differences, and a charge pump coupled to the phase frequency detector and the voltage control delay line unit capable of increasing or decreasing voltage. The circuit is further defined by at least one symmetric NOR coupled to the voltage control delay line unit capable of combining signals with identical rising edges, at least one symmetric NAND coupled to at least one symmetric NOR capable of combining signals with identical falling edges and a buffer coupled to at least one symmetric NAND capable of buffering the multiple of the CPU clock signal.

A method for generating a custom clock frequency is also disclosed. The method includes receiving a CPU clock signal, delaying the CPU clock signal with at least two inverters and generating a plurality of output signals. The method also includes combining a plurality of signals from the plurality of output signals to generate a combined custom clock signal.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for circuitry and methods for generating a custom clock frequency in a central processing unit (CPU). For example, in one embodiment of the invention, circuitry reduction on a microcore (core) can occur by merging multiple circuit elements, such as merging multiple floating-point graphics units (FGUs) into one floating-point graphics unit (FGU). During one CPU clock cycle, the FGU processes multiple IEU input signals. Thus, the FGU operates at a higher frequency than the CPU system clock to process the IEU input signals. In the following description, numerous specific details are set forth in order to provide a thorough understanding of the present invention. It will be apparent however, that the present invention may be practiced without some or all of these specific details. In other instances, well known process steps have not been described in detail in order not to unnecessarily obscure the present invention.

Figure 3:
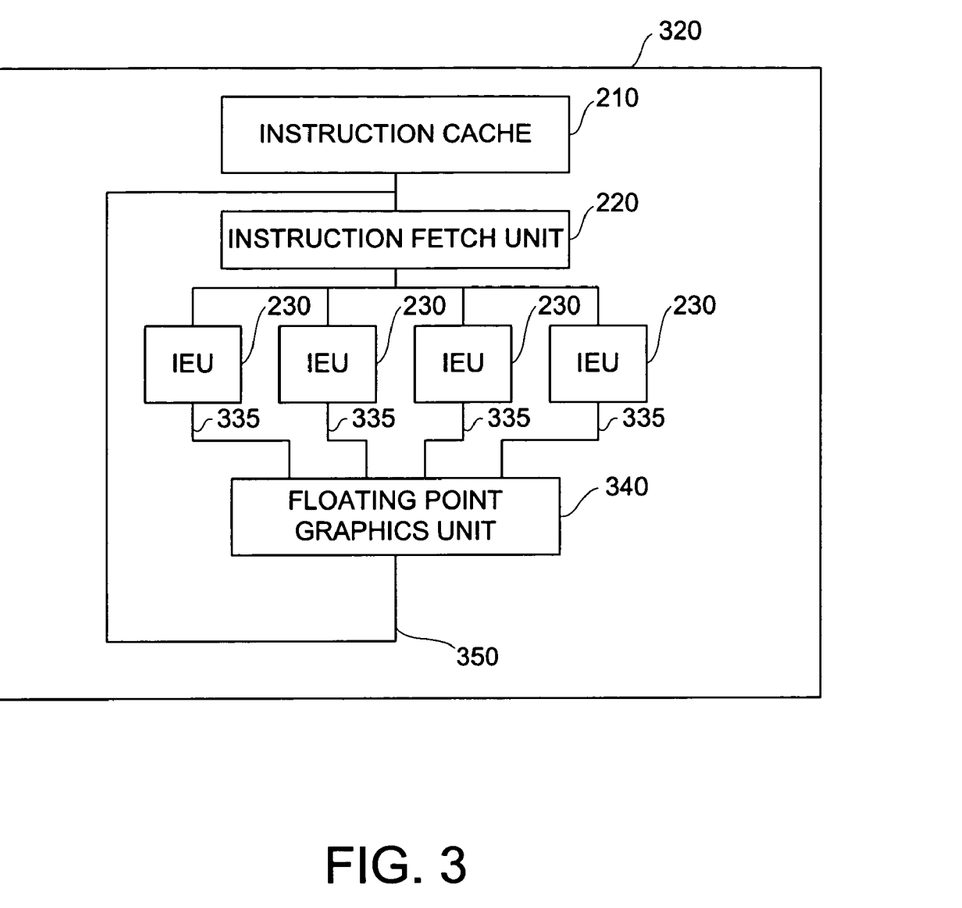
FIG. 3 is a diagram illustrating the elements of a core in the CPU, in accordance with an embodiment of the present invention.
Figure 4:
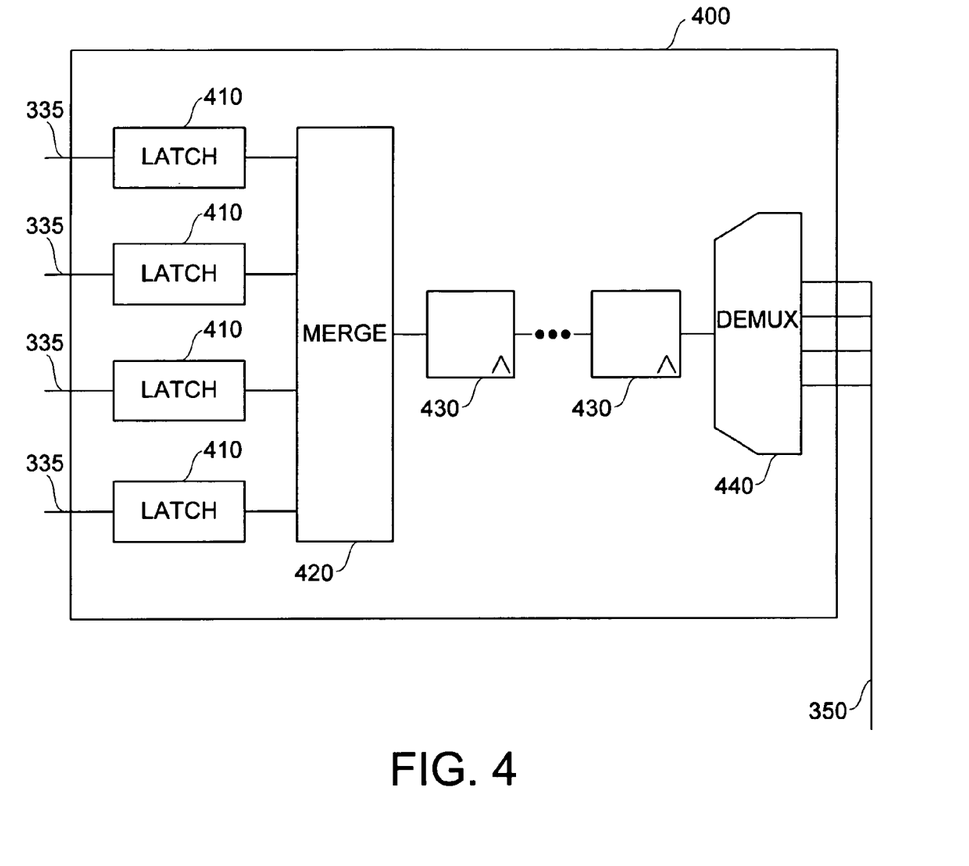
FIG. 4 is a high-level diagram illustrating the generation of a multiple of a CPU clock signal using a multiplier pipeline, in accordance with an embodiment of the present invention.

FIG. 3 is a diagram illustrating the elements of a core 320 in CPU 110 (FIG. 1), in accordance with an embodiment of the present invention. Core 320 receives multiple FGU input 335 signals from four IEUs 230 (FIG. 2). After FGU 340 completes floating point and graphics computations, output travels to IFU 220 via a bi-directional FGU output 350. Core 320 differs from core 120 by the merging of four FGUs 240 into one FGU 340. Thus, FGU 340 is capable of simultaneously processing four IEU 230 outputs via FGU inputs 335. To enable FGU 340 computations, FGU 340 includes one multiplier pipeline and one adder pipeline. FIG. 4 is a high-level diagram 400 illustrating the generation of a multiple of a CPU clock signal using a multiplier pipeline, in accordance with an embodiment of the present invention.

In FIG. 4, IEU 230 (FIG. 2) signals enter FGU 340 (FIG. 3) via FGU inputs 335. A latch 410 receives the IEU 230 input signal, which propagates to a merge unit 420. Within merge unit 420, four IEU 230 input signals generated during one CPU clock cycle merge into a higher frequency signal operating at four times the frequency of the CPU system clock. The higher frequency signal is then propagated to a multiplier pipeline 430. Although an adder pipeline is not shown, the adder pipeline has a similar structure to multiplier pipeline 430. After multiplication and addition operations, the higher frequency signal propagates through a demultiplexer 440 to send output to IFU 220 via FGU output 350. It should be apparent that other configurations of the circuit elements in high-level diagram 400 are possible without departing from the purpose of generating a custom clock frequency. For example, any number of IEUs 230 can generate input signals to merge unit 420.

Figure 5:
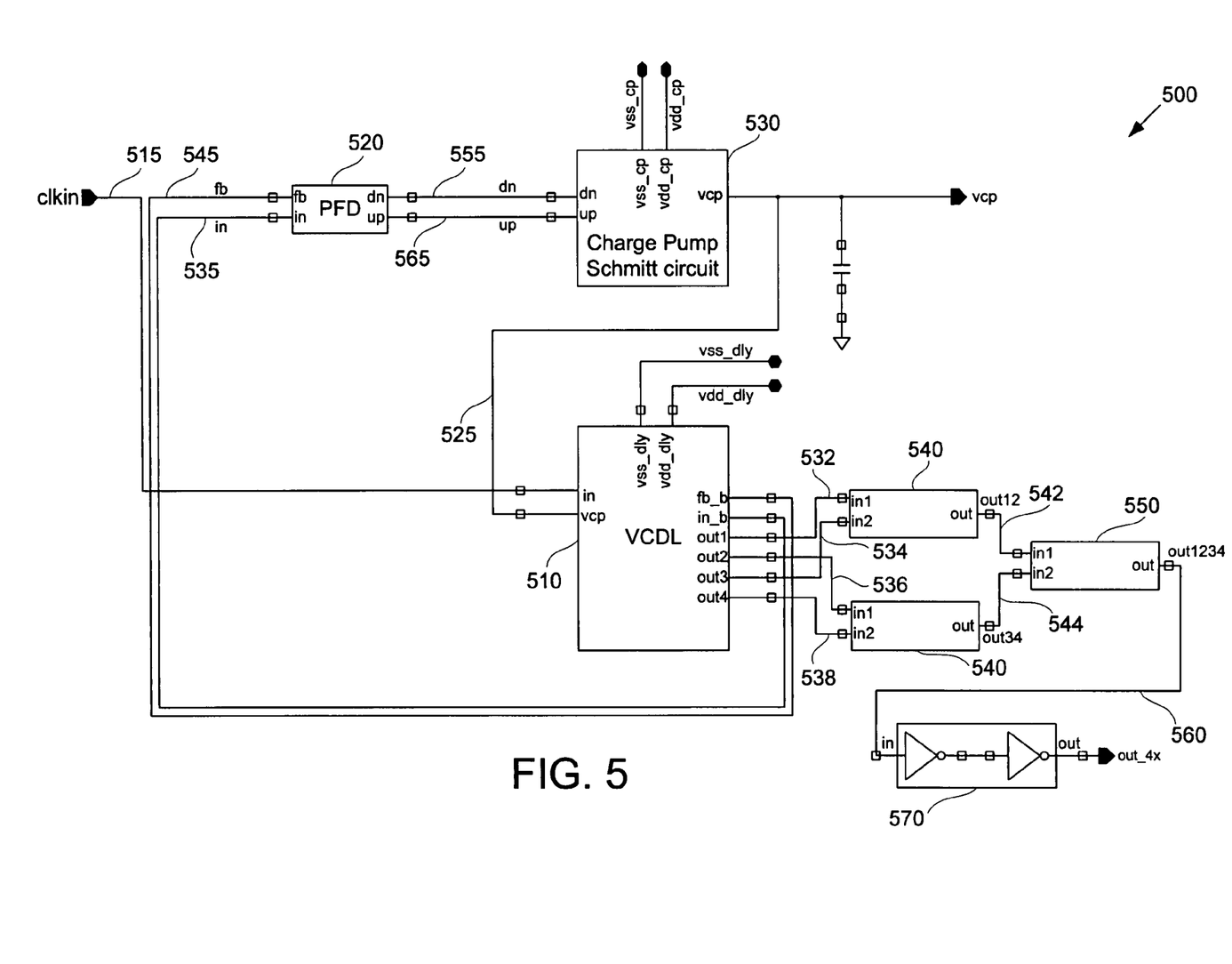
FIG. 5 is a circuit diagram illustrating circuit elements, in accordance with an embodiment of the present invention.
Figure 6:
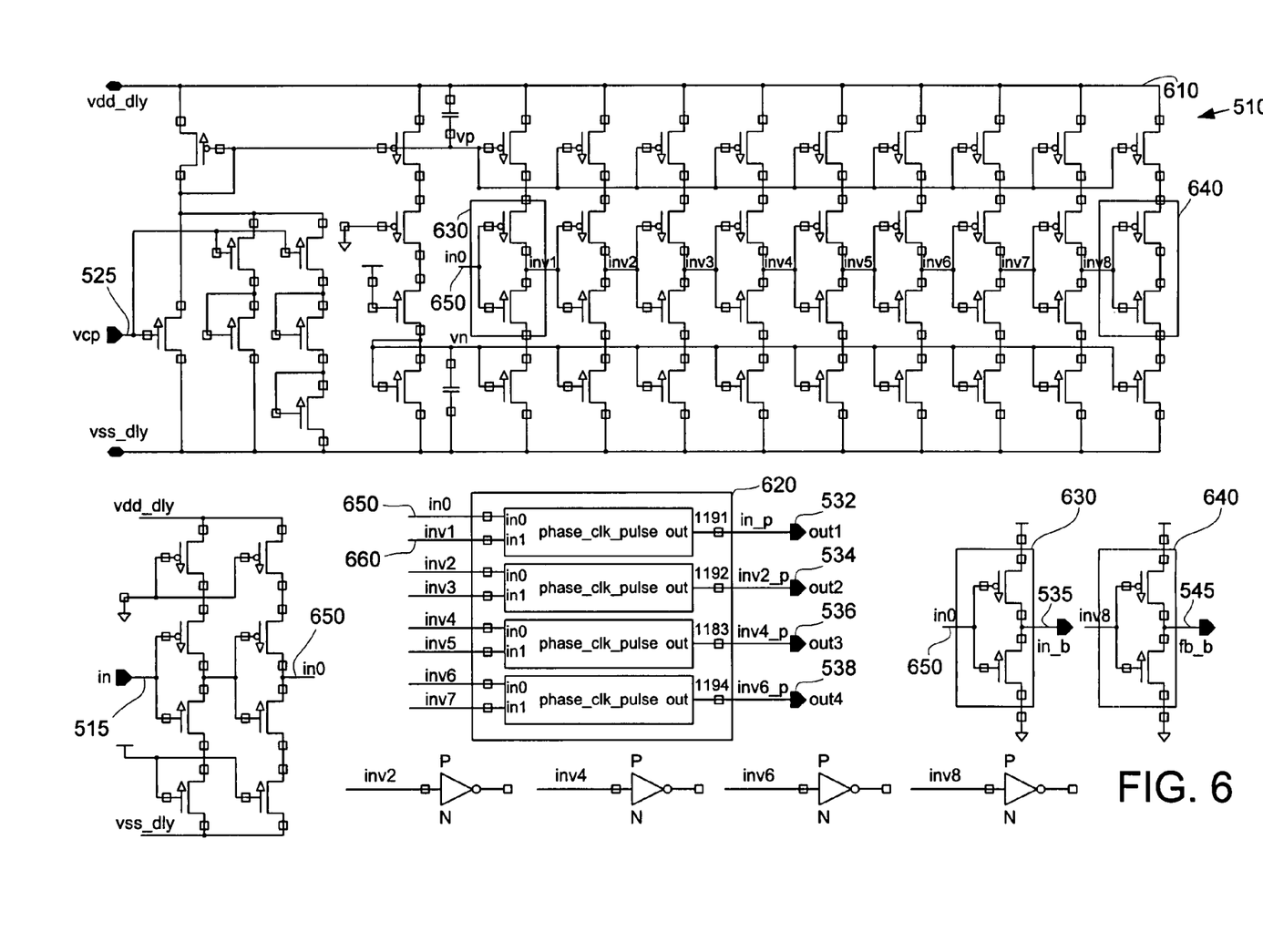
FIG. 6 is a circuit diagram illustrating circuit elements within a voltage control delay line unit, in accordance with an embodiment of the present invention.

FIG. 5 is a circuit diagram illustrating circuit elements, in accordance with an embodiment of the present invention. In one exemplary embodiment, within merge unit 420 (FIG. 4) is a delay-locked loop (DLL) 500 circuit capable of generating a custom clock frequency. A CPU clock signal 515 enters the DLL 500 circuit and propagates to a voltage control delay line unit (VCDL) 510. A control signal 525, an internal signal of the DLL 500 circuit, also enters VCDL 510. More circuitry within VCDL 510, as shown in FIG. 6, further generate multiple output signals. The multiple output signals, or multiple delayed clock signals, can be a first signal 535, a last signal 545, a first output signal 532, a second output signal 534, a third output signal 536 and a fourth output signal 538. First signal 535 and last signal 545 propagate to a phase frequency detector (PFD) 520, which detects a phase difference between first signal 535 and last signal 545. PFD 520 then generates a down voltage signal 555 and an up voltage signal 565, both of which enter a charge pump 530. Thereafter, charge pump 530 adjusts control signal 525.

The remaining output signals from VCDL 510 enter two symmetric NORs 540. First output signal 532 and third output signal 536 enter one symmetric NOR 540 while second output signal 534 and fourth output signal 538 enter another symmetric NOR 540. The symmetric NORs 540 then generate a first combined output signal 542 and a second combined output signal 544. These two signals enter a symmetric NAND 550, which generates a custom combined clock signal 560. Custom combined clock signal 560 is then buffered with a buffer 570 for output to the multiplier and adder pipelines as shown in FIG. 4.

A phase-locked loop (PLL) circuit can generate a custom clock frequency. Specifically, the PLL circuit can generate a clock signal outside core 320 (FIG. 3). However, this does not solve the problem of generating a higher frequency from within core 320 based on CPU clock signal 515. Alternatively, the PLL circuit can generate a clock signal within core 320. However, this solution suffers from jitter, or noise, because of the higher frequencies generated in core 320.

Further, a conventional DLL circuit can generate a custom clock frequency. However, conventional DLL circuits suffer from false locks and harmonic locks. False locks are the locking of signals at improper frequencies and harmonic locks occur via a signal lock to a non-deterministic multiple of CPU clock signal 515. In place of the PLL circuit and the conventional DLL circuit, an embodiment of the invention includes using the DLL 500 circuit to generate a custom clock frequency. As is later shown in FIG. 7A, one exemplary embodiment resolves problems with jitter, false locks and harmonic locks.

FIG. 6 is a circuit diagram illustrating circuit elements within VCDL 510 (FIG. 5), in accordance with an embodiment of the present invention. CPU clock signal 515 propagate through a delay unit 610 and a pulse generator 620. In one exemplary embodiment, delay unit 610 includes eight inverters. Each inverter delays CPU clock signal 515 by one-eighth of one CPU clock cycle. The delay occurs because control signal 525, which is precisely locked to an analog value, is used by the inverters to produce a one-eighth delay of CPU signal 515. The mechanism for a precise signal lock is later illustrated in FIG. 7B.

Accordingly, each inverter pair delays CPU clock signal 515 by one-quarter of one CPU clock cycle. Further, control signal 525 controls the signals delayed by each inverter. For example, when CPU clock signal 515 enters delay unit 610, CPU clock signal 515 uses a first inverter path 650 to enter a first inverter 630. Then, CPU clock signal 515 propagates through all inverters to a last inverter 640. While CPU clock signal 515 propagates through the inverters, control signal 525 controls the delay of the same inverters and by using pulse generator 620, generates first output signal 532, second output signal 534, third output signal 536 and fourth output signal 538. Specifically, pulse generator 620 generates a signal by using a rising edge of CPU clock signal 515 through one inverter and a falling edge of CPU clock signal 515 through a second inverter. Thus, as an example, pulse generator 620 uses the rising edge of the signal propagated through first inverter path 650 and the falling edge of the signal propagated through an inverter path 660 to generate first output signal 532.

Figure 7A:
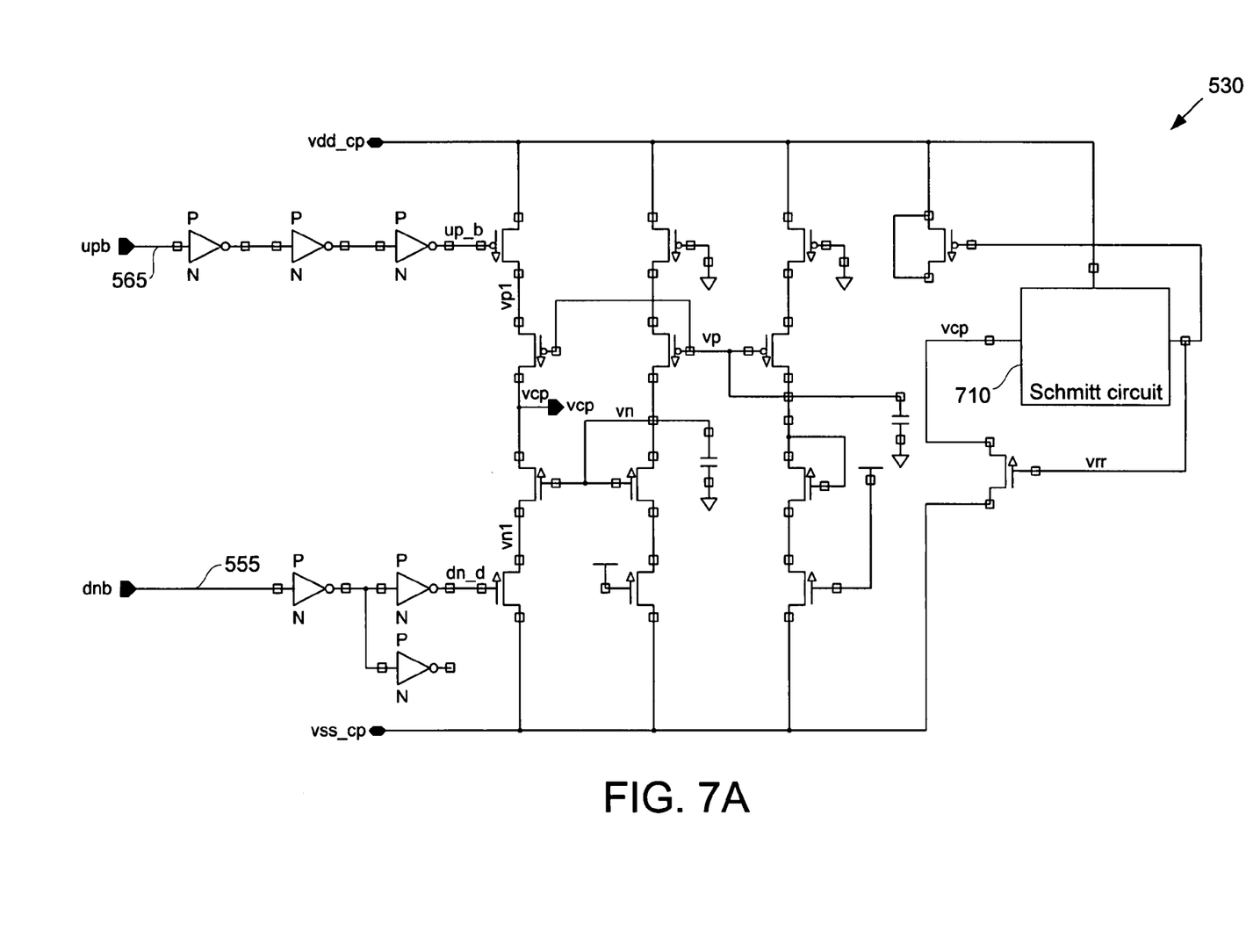
FIG. 7A is a circuit diagram illustrating circuit elements within a charge pump, in accordance with an embodiment of the present invention.

Returning to FIG. 5, VCDL 510 generates multiple output signals that propagate to PFD 520 or symmetric NORs 540. After PFD 520 generates down voltage signal 555 and up voltage signal 565, charge pump 530 locks in a voltage value to generate control signal 525. FIG. 7A shows a circuit diagram illustrating circuit elements such as a Schmitt circuit 710, within charge pump 530, in accordance with an embodiment of the present invention. Control signal 525 is an analog value, which sets the delays for the inverters in delay unit 610 (FIG. 6). If delay unit 610 is too slow, then charge pump 530 increases the voltage. Alternatively, if delay unit 610 is too fast, then charge pump 530 decreases the voltage.

Figure 7B:
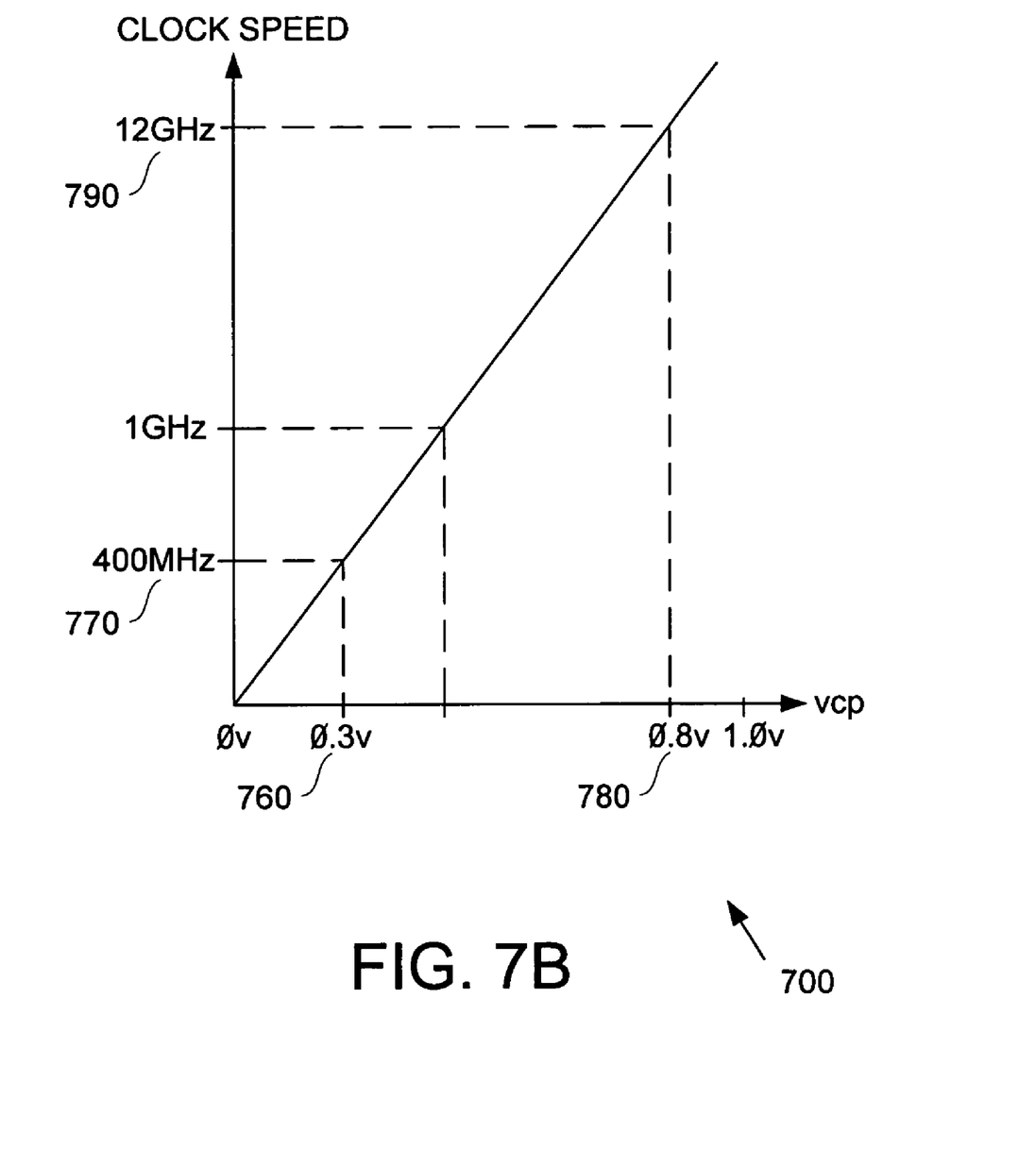
FIG. 7B is a graph illustrating a signal lock of a control signal, in accordance with an embodiment of the present invention.

In one embodiment, charge pump 530 (FIG. 5) includes Schmitt circuit 710 (FIG. 7A) to avoid and prevent false locks and harmonic locks. FIG. 7B is a graph 700 illustrating a signal lock of control signal 525, in accordance with an embodiment of the present invention. Graph 700 shows control signal 525 voltage values along an x-axis and clock speed values along a y-axis. For example, if CPU clock signal 515 can equal any value from about 400 MHz to about 12 GHz, then a multiple of CPU clock signal 515 has a voltage value between about 0.3V 760 and about 0.8V 780. It should be apparent that the voltage values and clock speeds are exemplary and that many other values are possible within any defined voltage value range, as long as charge pump 530 increases and decreases control signal 525 to an appropriate voltage level to enable a precise signal lock. For example, if control signal 525 is above approximately 0.8V, then Schmitt circuit 710 decreases the voltage. Thus, by manipulating control signal 525, charge pump 530 avoids and prevents false locks and harmonic locks.

Figure 8:
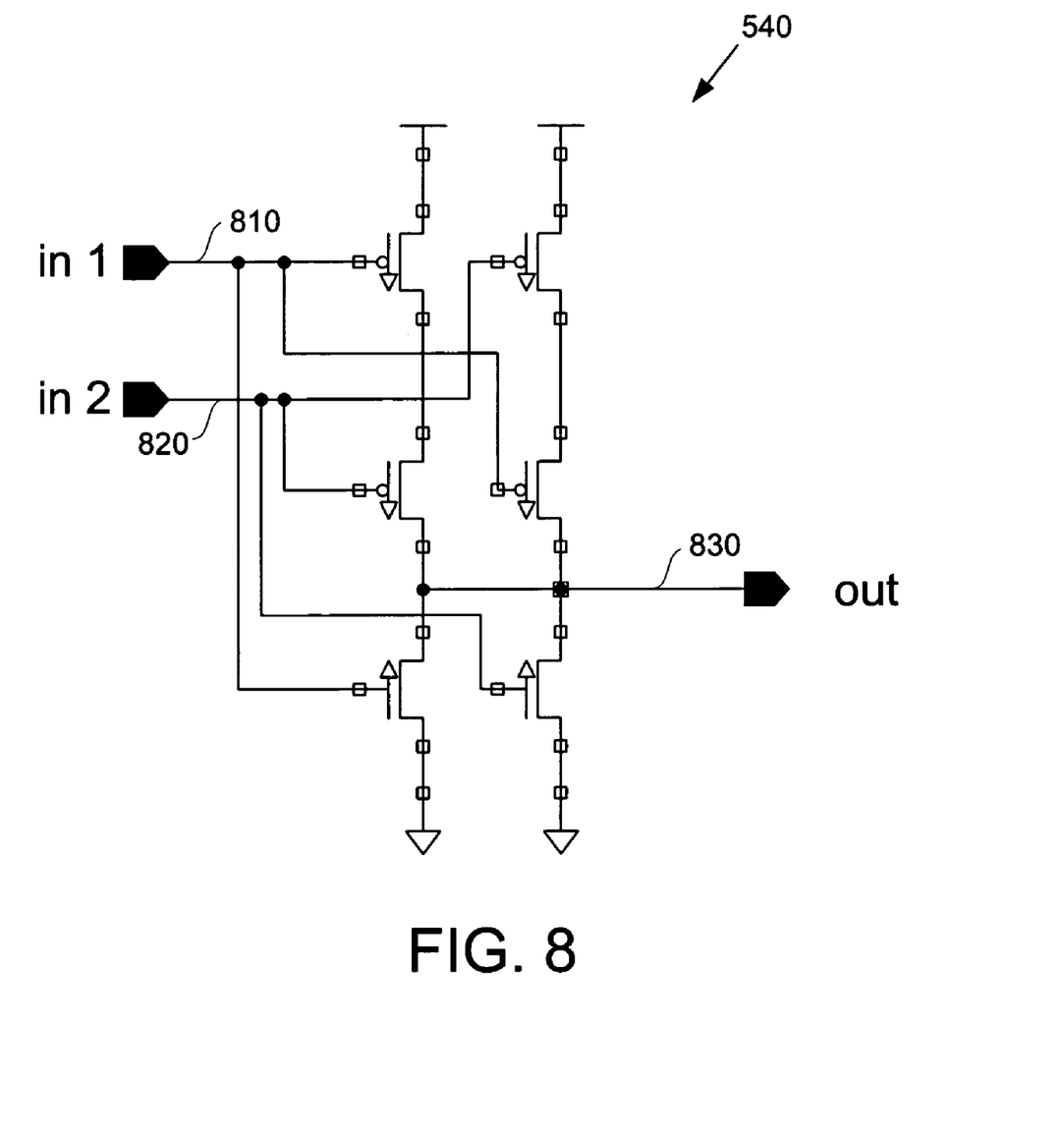
FIG. 8 is a circuit diagram illustrating circuit elements within a symmetric NOR, in accordance with an embodiment of the present invention.

VCDL 510 also generates output signals to symmetric NORs 540. FIG. 8 is a circuit diagram illustrating circuit elements within a symmetric NOR 540, in accordance with an embodiment of the present invention. Typically, a standard NOR gate (not shown) does not properly balance rising edges of input signals when the input signals have high frequencies. Accordingly, when the NOR gate receives two signals, the rising edge of one signal will not be substantially identical to the rising edge of the second signal. In contrast, symmetric NORs 540 receiving two signals such as first signal 810 and a second signal 820 have substantially identical rising edges. Thus, symmetric NORs 540 can generate first combined output signal 542 and second combined output signal 544.

Figure 9:
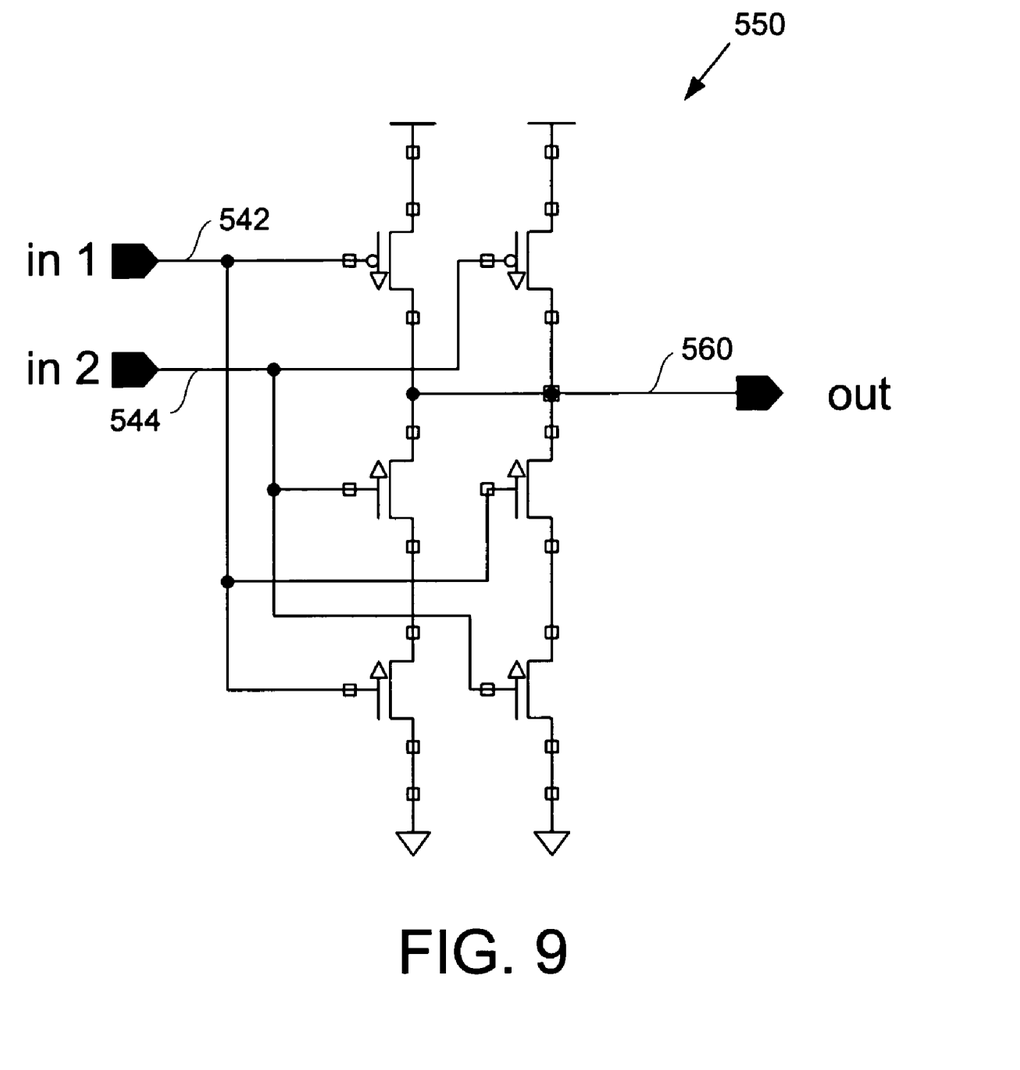
FIG. 9 is a circuit diagram illustrating circuit elements within a symmetric NAND, in accordance with an embodiment of the present invention.

FIG. 9 is a circuit diagram illustrating circuit elements within a symmetric NAND 550 (FIG. 5), in accordance with an embodiment of the present invention. Symmetric NAND 550 (FIG. 5) generates custom combined clock signal 560 by providing substantially identical falling edges for first combined output signal 542 and second combined output signal 544. Similar to the problem encountered by using a standard NOR gate, a standard NAND gate (not shown) cannot provide balanced falling edges.

In another embodiment, two symmetric NANDs 550 and one symmetric NOR 540 can replace two symmetric NORs 540 and one symmetric NAND 550, respectively. Accordingly, inputs to the symmetric NANDs will have substantially identical falling edges to generate first combined output signal 542 and second combined output signal 544. Then, symmetric NOR 540 will generate custom combined clock signal 560 by using substantially identical rising edges of the signals.

Figure 10:
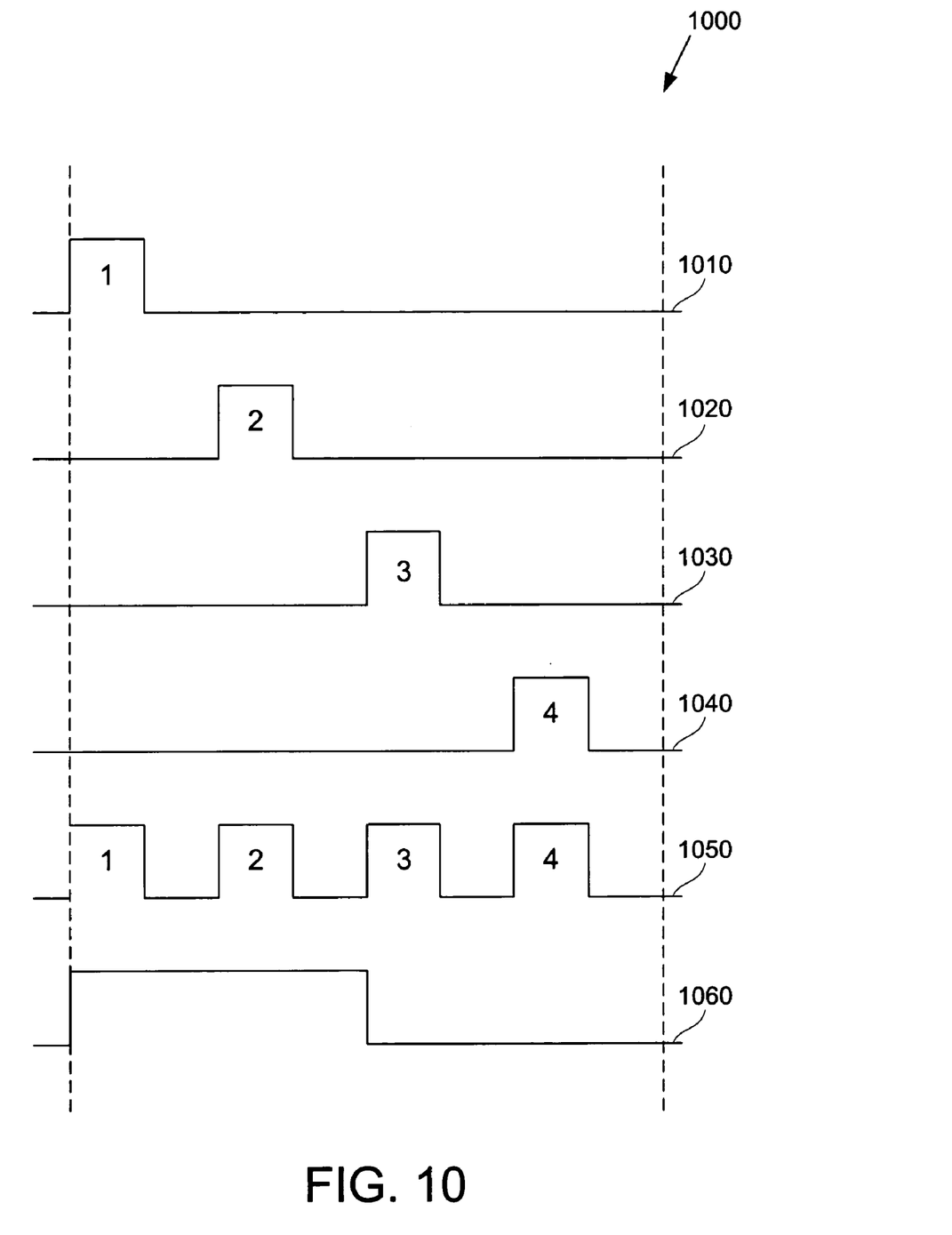
FIG. 10 is a timing diagram illustrating the generation of the multiple of the CPU clock signal, in accordance with an embodiment of the present invention.

FIG. 10 is a timing diagram 1000 illustrating the generation of the multiple of the CPU clock signal, in accordance with an embodiment of the present invention. A CPU clock cycle 1060 is one clock cycle of CPU clock signal 515. Thus, a first timing signal 1010 corresponds to first output signal 532 and a second timing signal 1020 corresponds to second output signal 534. Similarly, a third timing signal 1030 corresponds to third output signal 536 and a fourth timing signal 1040 corresponds to fourth output signal 538. When symmetric NOR 540 combines first output signal 532 and third output signal, first timing signal 1010 and third timing signal 1030 combine to form first combined output signal 542. Similarly, when symmetric NOR 540 combines second output signal 534 and fourth output signal 538, second timing signal 1020 and fourth timing signal 1040 combine to form second combined output signal 542. Consequently, after symmetric NAND 550 generates custom combined clock signal 560, a combined timing signal 1050 shows a higher frequency clock operating at four times the speed of CPU clock cycle 1060. Thus, the higher frequency clock is the multiple of the CPU clock. Although eight inverters produce a high frequency clock speed operating at four times the CPU clock speed, more or less inverters can be used to generate other custom clock frequencies.

Figure 11:
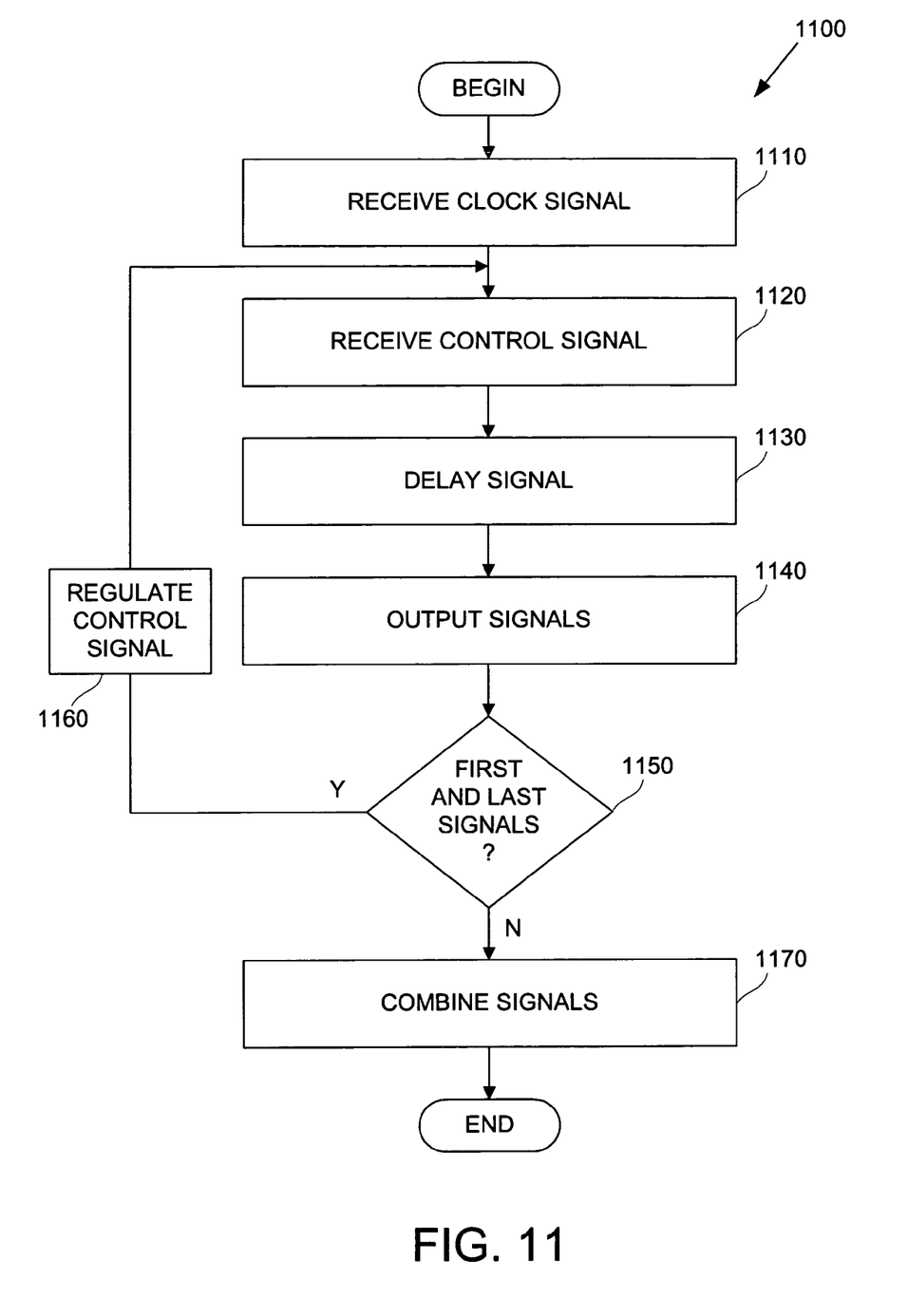
FIG. 11 is a flowchart showing a method for generating the multiple of the CPU clock signal, in accordance with an embodiment of the present invention.

FIG. 11 is a flowchart 1100 showing a method for generating the multiple of the CPU clock signal, in accordance with an embodiment of the present invention. The method begins when VCDL 510 (FIG. 5) receives a clock signal in step 1110. Then, VCDL 510 receives control signal 525 from charge pump 530 in step 1120. In the following step 1130, delay unit 610 (FIG. 6) delays the CPU clock signal and in step 1140, pulse generator 620 outputs signals. In step 1150, if the output signals are first and last signals from first inverter 630 and last inverter 640, respectively, then the method proceeds to step 1160, where PFD 520 and charge pump 530 regulate control signal 525. Alternatively, if the output signals are not first and last signals from first inverter 630 and last inverter 640, then the method proceeds to step 1170. In this step, symmetric NORs 540 and symmetric NAND 550 combine signals to generate custom combined clock signal 560. Thereafter, the method ends and repeats during another CPU clock cycle 1060 (FIG. 10).

Embodiments of the present invention may be practiced with various computer system configurations including hand-held devices, microprocessor systems, microprocessor-based or programmable consumer electronics, minicomputers, mainframe computers and the like. The invention can also be practiced in distributing computing environments where tasks are performed by remote processing devices that are linked through a wire-based or wireless network.

With the above embodiments in mind, it should be understood that the invention can employ various computer-implemented operations involving data stored in computer systems. These operations are those requiring physical manipulation of physical quantities. Usually, though not necessarily, these quantities take the form of electrical or magnetic signals capable of being stored, transferred, combined, compared and otherwise manipulated.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can also be distributed over a network-coupled computer system so that the computer readable code is stored and executed in a distributed fashion.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A processor, comprising:
   a cache capable of storing data;
   a control logic capable of controlling a flow of data; and
   at least one core coupled to the cache and the control logic, the at least one core comprising:
   an instruction cache capable of storing data;
   an instruction fetch unit capable of fetching data;
   a plurality of integer execution units coupled to the instruction fetch unit, each integer execution unit generating, in response to the data, an output signal at a first frequency, the first frequency being a frequency of the CPU clock signal;
   a plurality of latches, each latch connected to receive the output signals from the integer execution units;
   a merge unit, the merge unit generating a merged signal containing the output signals at a second frequency, the second frequency being a multiple of the first frequency; and
   a floating point graphics unit, the floating point graphics unit comprising logic for processing the merged signal at the second frequency, the processing comprising performing floating point arithmetic operations.

2. The processor of claim 1, wherein the merge unit comprises a delay-locked loop (DLL) circuit having a charge pump, the DLL circuit being capable of generating a clock signal at the second frequency.

3. The processor of claim 2, wherein the DLL circuit comprises a voltage control delay line unit capable of generating multiple delayed clock signals.

4. The processor of claim 2, wherein the DLL circuit further comprises a control signal capable of delaying the CPU clock signal by propagating the CPU clock signal through a plurality of inverters.

5. The processor of claim 3, wherein the DLL circuit further comprises at least one symmetric NOR and one symmetric NAND capable of combining signals.

6. The processor of claim 5, wherein the voltage control delay line unit comprises a delay unit having at least two inverters capable of delaying the CPU clock signal.

7. The processor of claim 6, wherein a first delayed clock signal and a last delayed clock signal from the voltage control delay line unit are compared by a phase frequency detector and converted into a control signal by the charge pump.

8. The processor of claim 7, wherein the DLL circuit further comprises Schmitt circuit, capable of increasing or decreasing a voltage of the control signal.

9. The processor of claim 1, wherein the multiple of the CPU clock signal comprises a higher frequency clock having a higher frequency than the CPU clock signal.

10. The processor of claim 1, wherein the single floating-point graphics unit comprises a multiplier pipeline and an adder pipeline.

11. A floating point graphics unit for processing multiple integer execution unit input signals in a single cycle of a CPU clock signal the floating point graphics unit, comprising:
    a voltage control delay line unit capable of generating multiple delayed clock signals from the CPU clock signal, the multiple delayed clock signal including a first signal and a last signal;
    a plurality of pulse generators each generating a pulse signal timed in accordance with one of the delayed clock signals;
    a phase frequency detector coupled to the voltage control delay line unit capable of detecting phase differences between the first signal and the last signal, the phase frequency detector generating a phase frequency detector output;
    a charge pump coupled to the phase frequency detector and the voltage control delay line unit capable of increasing or decreasing a control signal voltage in response to the phase frequency detector output;
    at least one symmetric NOR gate and at least one symmetric NAND gate coupled to the voltage control delay line unit capable of combining a plurality of the pulse signals and generating an output clock signal having a frequency that is a multiple of the CPU clock signal; and
    a buffer capable of buffering the output clock signal and generating a buffered output clock signal, the buffered output clock signal driving the floating point graphics unit.

12. The floating point graphics unit of claim 11, wherein the voltage control delay line unit comprises a plurality of inverters capable of delaying the CPU clock signal.

13. The floating point graphics unit of claim 11, wherein the control signal voltage is an analog value.

14. The floating point graphics unit of claim 11, wherein the output clock signal has a frequency that is a multiple of a frequency of the CPU clock signal.

* * * * *